United States Patent [19]
Ajit

[11] Patent Number: 5,757,033
[45] Date of Patent: May 26, 1998

[54] BIDIRECTIONAL THYRISTOR WITH MOS TURN-OFF CAPABILITY WITH A SINGLE GATE

[75] Inventor: Janardhanan S. Ajit, Redondo Beach, Calif.

[73] Assignee: International Rectifier Corporation, El Segundo, Calif.

[21] Appl. No.: 517,059

[22] Filed: Aug. 21, 1995

Related U.S. Application Data

[62] Division of Ser. No. 272,769, Jul. 8, 1994, Pat. No. 5,483,087.
[51] Int. Cl.$^6$ .................... H01L 29/74; H01L 31/111
[52] U.S. Cl. .................... 257/120; 257/121; 257/125; 257/128; 257/137; 257/138; 257/162
[58] Field of Search .................... 257/120, 121, 257/124, 125, 128, 133, 137, 138, 162

[56] References Cited

U.S. PATENT DOCUMENTS 4,967,244 10/1990 Bauer.
5,105,244 4/1992 Bauer .................... 257/138

*Primary Examiner*—Ngân V. Ngô
*Attorney, Agent, or Firm*—Ostrolenk, Faber, Gerb & Soffen, LLP

[57] ABSTRACT

A bidirectional thyristor structure with a single MOS gate controlled turn off capability. In a vertical conduction embodiment, the device has a six layer structure including a backside diffusion. One vertical conduction structure includes a single body region at the first surface of the device for conduction in both the forward and reverse directions. Another vertical conduction structure includes a two body regions at the first surface, one for controlling forward conduction and the other for controlling reverse conduction. The vertical conduction embodiments are preferably implemented in a cellular geometry, with a large number of symmetrical cells connected in parallel. The bidirectional thyristor of the present invention can also be provided in a lateral conduction structure for power IC applications.

8 Claims, 14 Drawing Sheets

5,757,033

BIDIRECTIONAL THYRISTOR WITH MOS TURN-OFF CAPABILITY WITH A SINGLE GATE

This is a division of application Ser. No. 08/272,769, filed Jul. 8, 1994, now U.S. Pat. No. 5,483,087.

BACKGROUND OF THE INVENTION

1. Field of the Invention

The present invention relates to a bidirectional thyristor and, more particularly, to a bidirectional thyristor structure with single MOS gate controlled turn-off capability.

2. Description of the Related Art

Power semiconductor structures that combine bipolar conducting mechanisms with a MOS control are well known. The insulated gate bipolar transistor (IGBT) is an example of such a device, in which the base current of a bipolar structure is controlled via an integrated MOSFET. The IGBT is simple to control like a power MOSFET, but advantageously has a lower on-state voltage drop compared to power MOSFET for voltages greater than 500 volts. The on-state voltage drop of the IGBT is increased when the IGBT is designed for higher blocking voltages (>1000V).

For higher voltages, a thyristor structure has been developed which advantageously has a lower on-state voltage drop compared to IGBT and in which a cathode short circuit is switched via a MOS gate. Such a structure, known as a MOS controlled thyristor or MCT, and described in an article by V. A. K. Temple, *IEEE International Electron Device Meeting (IEDM) Technical Digest*, San Francisco (December 1984), pp. 282-85, is turned on and off by a single MOS gate. While the MCT has an asymmetric structure and can conduct current in only one direction, bidirectional thyristor structures with MOS turn-off capability have also been developed—see, e.g., U.S. Pat. Nos. 4,816,892 and 5,040,042. These bidirectional thyristors are useful in ac switching applications.

In conventional MCTs and bidirectional thyristors, a lightly doped N⁻ base region (the base region of the bottom PNP transistor) is used to support voltage in the blocking condition. For fast turn-off characteristics, the P base of the NPN transistor is desirably connected to ground potential and the N base of the PNP transistor is desirably connected to the high anode potential. However, connecting the N base to the high anode potential can only be achieved by using anode shorts, which destroys the reverse blocking capability of the device, or by using MOS gates on the back-side of the device, such as in U.S. Pat. Nos. 4,816,892 and 5,040,042, which makes device fabrication difficult.

U.S. Pat. No. 4,857,983 to Baliga et al. describes a device (FIG. 1) which, by using an N⁺ diffusion 20 on the backside of the wafer, achieves reverse conduction characteristics without the above-noted disadvantages. In FIG. 1, the device is turned-on in the forward direction (anode positive with respect to cathode) by applying a sufficiently positive potential to gate 2 to create an n-channel in the P⁻ base 14, thus electrically coupling N⁺ region 7 and N⁺ region 8, which in turn is directly connected to cathode electrode 6. This couples the four layer structure formed by P layer 10, N⁻ layer 12, P⁻ region 14 and N⁺ region 7 to the cathode through the series n-channel MOSFET and the structure then assumes a regenerative conducting state, providing an active base drive to the inherent PNP bipolar transistor formed of P layer 10, N⁻ layer 12 and P⁻ region 14. When the gate voltage is reduced sufficiently or made zero, N⁺ region 7 is decoupled from N⁺ region 8 and from the cathode, and conduction ceases.

As is apparent from the prior art FIG. 1 device, the boundary between N⁻ layer 12 and P⁻ region 14, and the boundary between N⁻ layer 12 and P⁺ region 16, form the forward blocking junctions of the device, and most of the blocking voltage is supported in the N⁻ layer, the base region of the bottom PNP transistor. An inherent parasitic thyristor structure exists in the forward direction, formed by P layer 10, N⁻ layer 12, P⁻ region 14 and N⁺ region 8.

In the reverse direction (anode 4 negative with respect to cathode 6) and with a sufficiently negative potential applied to the gate structure 2 to keep all MOS gates at zero potential, conduction occurs through the four layer structure formed by P⁺ region 16, N⁻ layer 12, P layer 10 and backside N⁺ region 20. This four layer structure provides regenerative conduction in the reverse direction. In response to the application of a sufficiently positive potential to gate structure 2, regenerative conduction of the four layer structure ceases because of the resulting n-channels created in P region 16, shorting N⁻ layer 12 to N⁺ regions 22 and to cathode electrode 6 connected thereto. This short of the PN junction between P⁺ region 16 and N⁻ layer 12 reduces the injection from this junction and interrupts regenerative conduction. The boundary between N⁻ layer 12 and P layer 10 forms the reverse blocking junction of the device, and most of the blocking voltage is supported in the N⁻ layer, the base region of the upper PNP transistor.

Disadvantageously, in the device of FIG. 1, the N⁻ base (N⁻ layer 12) of the wide-base PNP transistor is not connected to the high anode potential when the device is turned-off from the forward conducting state, thus degrading the forward turn-off characteristics of the device. Also, as mentioned above, the device has an inherent parasitic thyristor which limits the MOS gate control capability of the device in the forward conducting state.

It is thus desirable to provide a single MOS gate controlled bidirectional thyristor without a parasitic thyristor and with improved turn-off characteristics.

SUMMARY OF THE INVENTION

The present invention provides a new MOS gate controlled bidirectional thyristor structure which overcomes the above-noted disadvantages of the prior art and attains the objectives set forth above.

The present invention achieves these objectives by supporting most of the blocking voltage in the collector region of the bottom PNP transistor in the forward blocking state and by supporting most of the blocking voltage in the collector region of the upper PNP transistor in the reverse blocking state.

The device of the present invention is formed on a wafer of semiconductor material having first and second spaced, parallel planar surfaces. The portion of the wafer which extends downward from the first planar surface comprises a relatively lightly doped substrate region of a first conductivity type for receiving junctions. The portion of the wafer which extends upward from the second semiconductor surface comprises a base region of a second conductivity type which is opposite to the first conductivity type.

In a vertical conduction embodiment, the device includes a single well region of the second conductivity type formed in the substrate region and extending from the first semiconductor surface to a first depth beneath the first semiconductor surface. The well region is radially inwardly spaced along the first semiconductor surface to define a first channel region in the lightly doped region of a first conductivity type.

At least one body region of the first conductivity type is formed in the well region and extends downward from the first semiconductor surface to a second depth beneath the first semiconductor surface which is shallower than the first depth. The body region is radially inwardly spaced along the first semiconductor surface from the well region to define a second channel region along the first semiconductor surface between the body region and the lightly doped region, in the well region.

A source region of the second conductivity type is formed in the body region and extends from the first semiconductor surface to a third depth beneath the semiconductor surface which is shallower than the second depth. The source region is radially inwardly spaced along the first semiconductor surface from the well region to define a third channel region on the body region along the first semiconductor surface between the source region and the well region.

A first electrode is located on the first semiconductor surface and is connected to the body region and the source region. A gate insulation layer on the first surface covers at least the channel regions. A gate electrode disposed on the gate insulation layer overlies the channel regions.

A relatively highly doped region backside diffusion of the first conductivity type is formed in a base region of the second conductivity type and extends from the second semiconductor surface over a portion of the second surface. A second electrode is disposed on the second semiconductor surface and is connected to the backside diffusion and the base region of second conductivity type.

The body region and/or the well region may be provided with a profile which includes a relatively deep, relatively highly doped region.

In an alternative vertical conduction embodiment, the device includes a second body region of the first conductivity type formed in the well region, the second body region being spaced from the relatively lightly doped substrate region by a portion of the well region. The first electrode is connected to the second body region in addition to the first body region and the source region. In this embodiment, the well region may be provided with a profile which includes a relatively deep, relatively highly doped portion.

In each of the above-noted embodiments, if the first conductivity type is P-type semiconductor material and the second conductivity type is N-type semiconductor material, then the first electrode is the cathode of the device and the second electrode is the anode of the device. Conversely, if the first conductivity type is N-type semiconductor material and the second conductivity type is P-type semiconductor material, then the first electrode is the anode of the device and the second electrode is the cathode of the device.

In a preferred implementation, the bidirectional thyristor of the present invention is provided in the form of a plurality of parallel-connected symmetrically disposed cells disposed on a wafer, and the first electrode is a grid which overlays the body regions and the well regions of adjacent cells. The cells preferably have a polygonal shape. The cells may each include a relatively highly doped diffused region spaced from the well region and extending from the first semiconductor surface, the relatively highly doped diffused region being disposed between respective well regions of adjacent cells. Termination structures may be provided on the first and second semiconductor surfaces at the edge of the full device.

In a lateral conduction embodiment of the invention, the relatively highly doped backside diffusion is moved up to the first surface of the device and disposed within a second well region of the second conductivity type. The second well region is laterally spaced from the first well region. The second electrode in this embodiment is also disposed on the first semiconductor surface and is connected to the second well region and to the relatively highly doped region contained therein. Trench isolation may optionally be provided adjacent the second well region.

The bidirectional thyristor of the present invention may optionally be provided with an integrated MOS-gated turn-on cell.

Advantageously, in the structure of the present invention, the lightly doped substrate region having, for example, P$^-$ type conductivity (and which then constitutes the collector region of a upper PNP transistor formed of the P body region, the N well region and the P$^-$ substrate and which also constitutes the collector region of a lower PNP transistor formed of the P-type backside diffusion, the N base and P$^-$ substrate, and which also constitutes the base region of a lower NPN transistor formed of the N well region, the P$^-$ substrate and the N base region), is used to support voltage in both the forward and reverse directions. This structure enables access to both the N base (the N base region) of the PNP transistor and the wide P$^-$ base (the P$^-$ substrate) of the NPN transistor during turn-off from the forward conducting state. During turn-off from the forward conducting state, the N base of the PNP transistor is connected to anode potential and the P$^-$ base of the NPN transistor is connected to cathode (ground) potential. This results in fast turn-off capability in the forward direction for the present invention. Advantageously, the structure of the present invention has no inherent parasitic thyristor in either the forward or reverse direction. Finally, the present invention not only achieves the foregoing, but also has gate controlled turn-on in the reverse direction.

Thus, the present invention, for the first time, provides a MOS gate controlled bidirectional thyristor structure without any parasitic thyristor structure, without any backside gates, with fast turn-off capability in the forward direction, with current saturation capability in the forward direction and with a single gate electrode.

Other features and advantages of the present invention will become apparent from the following description of the invention which refers to the accompanying drawings.

DETAILED DESCRIPTION OF THE PREFERRED EMBODIMENTS

Figure 1:
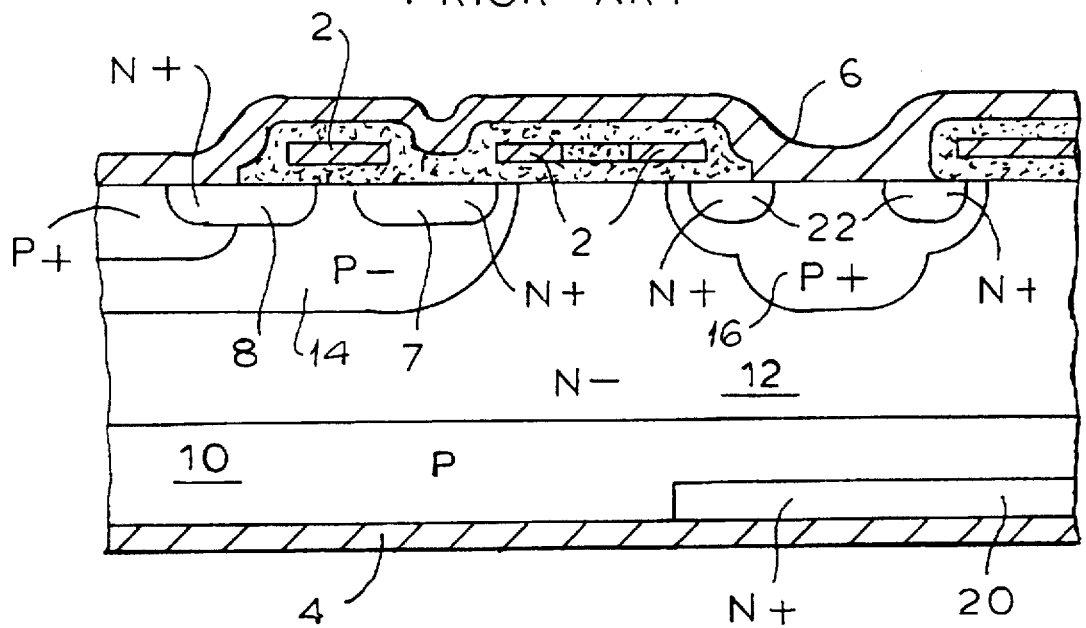
FIG. 1 is a cross-sectional view of the prior art device disclosed in U.S. Pat. No. 4,857,983 to Baliga et al.
Figure 2:
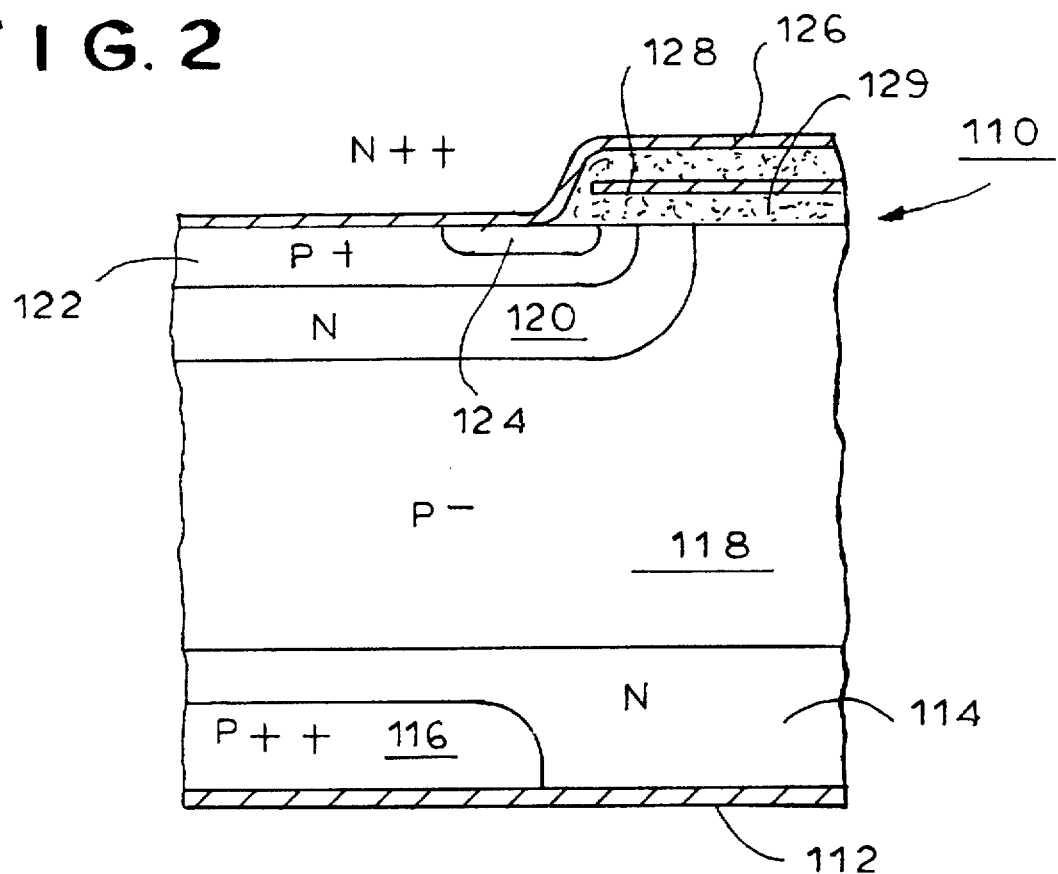
FIG. 2 is a cross-sectional view of the device structure of the three terminal bidirectional thyristor of the present invention.

A first embodiment of the single MOS gate controlled bidirectional thyristor structure of the present invention is shown in FIG. 2. As will be evident from the following description, the bidirectional thyristor of the present invention, like the prior art device shown in FIG. 1, basically consists of a PNPN thyristor in series with a n-channel MOSFET. However, in the prior art device, the bottom PNP transistor is a wide N-base PNP. In contrast, in the device of present invention, as described in detail below, the bottom PNP transistor is a narrow N base, wide P⁻ collector transistor.

Referring again to FIG. 2, bidirectional thyristor 110 of the present invention is a vertical conduction device built on a P⁻ type substrate 118. A highly doped P⁺⁺ region 116, is formed on a portion of the underside of an N base layer 114 disposed beneath P⁻ type substrate 118. An anode 112 on the bottom surface of the device contacts both N base layer 114 and P⁺⁺ region 116.

N-type layer 114 and P⁺⁺ layer 116 are preferably formed by back-side diffusions on a P⁻ type substrate 118. Disposed within P⁻ substrate layer 118 is an N-type well 120, which forms the drain of the n-channel MOSFET of the device, as described in further detail below. A P-type body region 122 (forming the channel region of the MOSFET) is disposed within N-type well 120, and a highly doped N⁺⁺ region 124 (forming the source of the MOSFET) is disposed within P body 122. P body 122 is preferably relatively highly doped (i.e. P⁺) as shown in FIG. 2.

A cathode electrode 126 on the first surface of the device covers both the P⁺ body 122 and at least a portion of the N⁺⁺ source region 124. A gate 128, preferably comprised of polysilicon, insulated from the first surface of the device by a layer of oxide 129, overlays P-body 122, N well 120 and P⁻ epi layer 118.

The operation of device 110 shown in FIG. 2 is as follows. In the forward direction (current conduction from anode to cathode, i.e. upward in FIG. 2), thyristor 110 is triggered to the on-state by applying a positive voltage to gate 128 with respect to cathode 126, while simultaneously applying a sufficiently high voltage to anode 112 or by photo (light) energy or by other well-known methods used for triggering SCRs. Thyristor 110 is kept in the on-state by maintaining a sufficient positive voltage on gate 128 with respect to cathode 126. The positive voltage on gate 128 must be sufficient to cause an inversion n-channel in P⁺ body 122, which connects N well 120 to N⁺⁺ region 124, thereby keeping the MOSFET in the ON-state and allowing conduction through the inverted channel and a regenerative turn-on of the thyristor. Thus, thyristor current in the forward mode flows from anode 112 to cathode 126 through the PNPN thyristor formed by P⁺⁺ backside diffusion 116, N base layer 114, P⁻ substrate 118, N well 120 and in series through the conductive MOSFET formed by N well 120, P⁺ body 122 and N⁺⁺ region 124.

To turn off the device, a sufficient negative voltage is applied to gate 128 with respect to cathode 126 causes N well 120 to be inverted to connect P⁻ substrate layer 118 to the ground potential of cathode 126, thus diverting the regenerative charge flow, and turning thyristor 110 off.

The forward blocking voltage is supported by the P⁻ substrate layer 118 and N base layer 114 plane-parallel junction and is determined mainly by the doping and thickness of the P⁻ substrate layer 118. Etch Contour Termination or Bevel Edge terminations similar to those used for triacs can be used to reduce the surface electric-field to improve the breakdown voltage. See B. J. Baliga, "High-voltage device termination techniques—A comparative review", *Proceedings of IEE*, Vol. 129, Pt. 1, No. 5, pp. 173–179, October 1982, incorporated by reference herein.

In the reverse direction (current conduction from cathode to anode, i.e. downward in FIG. 2), thyristor 110 is turned on by the application of a negative voltage on gate 128 with respect to cathode 126. The negative voltage on gate 128 must be sufficient to cause a P-type inversion channel connecting the P⁻ substrate layer 118 to P⁺ body region 122. This connects the P⁻ layer 118 to high potential, causing the N layer 114 to P⁻ layer 118 to become forward-biased, causing injection of carriers, which causes thyristor 110 to turn on regeneratively. After thyristor 110 has been triggered to the reverse conduction mode, the voltage on gate 128 can be reduced to the potential of cathode 126. Thyristor current in the reverse mode flows from cathode 126 to anode 112 through the PNPN thyristor formed by P⁺ body 122, N well 120, P⁻ substrate 118, and N base layer 114. Note that N⁺⁺ region 124 and P⁺⁺ backside diffusion 116 are inactive in the reverse conduction mode.

To turn off the device in the reverse direction, a sufficient positive voltage is applied to gate 128 with respect to cathode 126 to cause N well 120 to be connected to the potential of cathode 126 through a N-type inversion channel in P⁺ body 122. This shorts the base, N well 120, of the PNP transistor to the emitter, P body 122, causing thyristor 110 to turn-off. The N well 120 diffusion resistance and the resistance of the N-type inversion channel in P⁺ body 122 determines the maximum current that can be turned-off in the reverse direction. The reverse blocking voltage is supported by the P⁻ substrate layer 118 and N well 120 junction and is determined by the doping and thickness of P⁻ substrate layer 118 and also by the termination structure used. A standard high voltage device termination structure can also be used, for example, N-type doped floating field-rings and field plates. As discussed previously, Etch Contour Termination or Bevel Edge Termination can alternatively be used.

Figure 3:
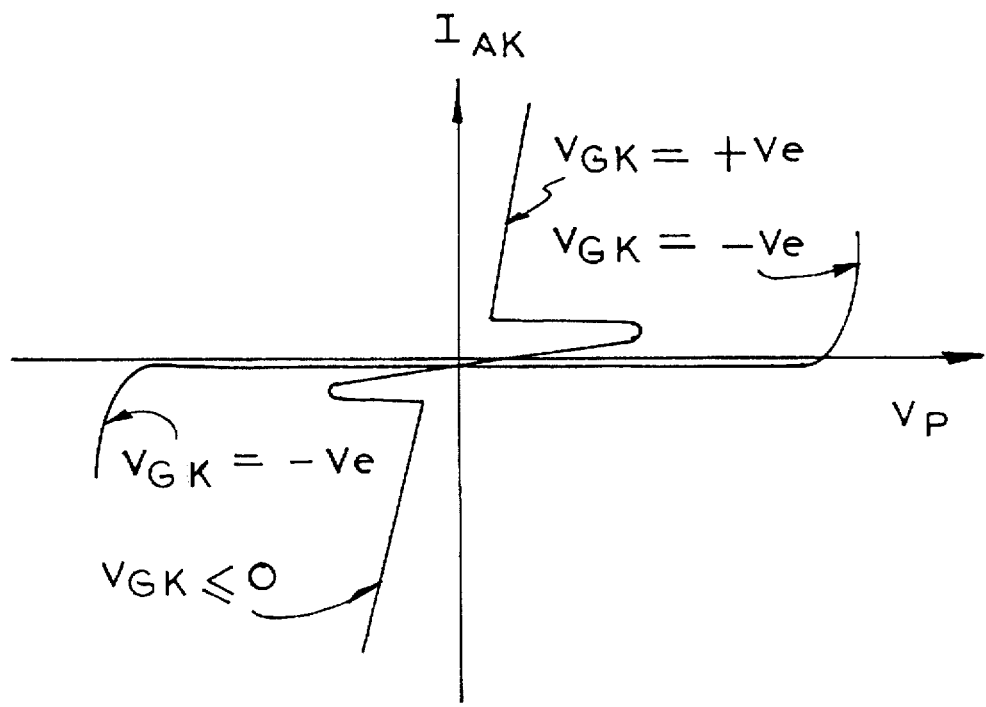
FIG. 3 shows the device characteristics of the three terminal bidirectional thyristor of FIG. 2.

FIG. 3 shows the characteristics for the device of FIG. 2, namely a plot of the voltage across the device versus the current through the device for various gate voltages. It will be seen that the device has the bilateral characteristics of a triac, and yet has gate-controlled turn-off capability.

Figure 4:
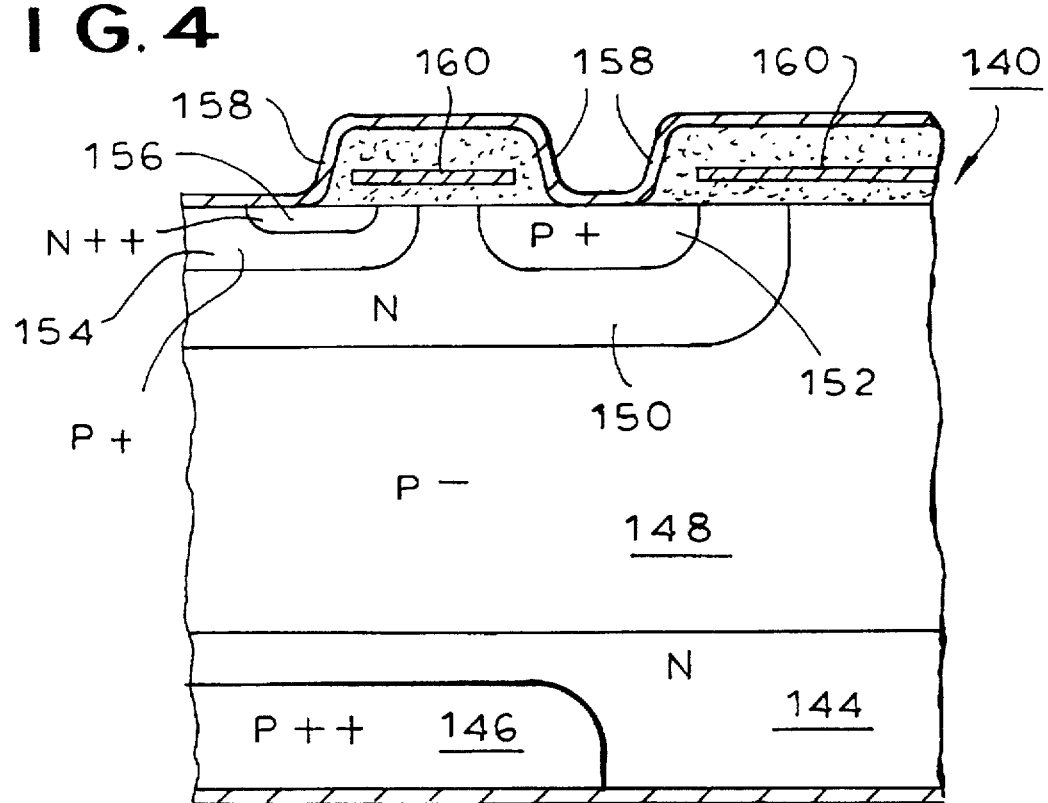
FIG. 4 is a cross-sectional view of an embodiment of the invention with two different types of cells.

Referring now to FIG. 4, an alternate embodiment of the present invention is illustrated in cross-sectional form. In the forward direction, the device of this embodiment consists of a PNPN thyristor in series with a n-channel MOSFET and, in the reverse direction, it consists of a NPNP thyristor with MOS-gate control. Bidirectional thyristor 140 includes a P-type substrate 148 having a N base region 144 and a P⁺⁺ backside diffusion region 146 disposed therein. An anode 142 on the bottom surface of the device covers both N-type base layer 144 and P⁺⁺ backside diffusion 146. A cathode 158 overlies the upper surface of the device.

An N-type layer 144 and P⁺⁺ type layer 146 are formed by backside diffusions on a P-type substrate 148. Disposed within P⁻ substrate layer 148 is an N-type well 150, which forms the drain of an n-channel MOSFET which controls the device, as described in further detail below. A pair of laterally spaced P-type body regions 152, 154 (preferably relatively highly doped, i.e. P⁺) are disposed within N-type well 150 at the first surface of the device. P⁺ body region 154 forms the "channel" region of the n-channel MOSFET which is used to control the device. A highly doped N⁺⁺ region 156 (forming the source of the n-channel MOSFET) is disposed within P⁺ body 154.

A polysilicon insulated gate 160 is provided on the first surface of the device in the form of a grid (not shown) which includes a first section overlying N⁺⁺ region 156, P⁺ body 154, N well 150 and P⁺ body 152. A second section of gate 160, electrically connected to the first section, overlies P⁺ body 152, N well 150 and P⁻ substrate 148.

The operation of device 140 shown in FIG. 4 is as follows. In the forward direction (conduction from anode to cathode, i.e. upward in FIG. 4), thyristor 140 operates in the same manner as the single-gate embodiment of FIG. 2. Thus, as in the embodiment of FIG. 2, the device is triggered to the on-state by applying a positive voltage to gate 160 with respect to cathode 158, while simultaneously applying a sufficiently high voltage to anode 142 or applying photo (light) energy or applying other well known methods used for triggering SCRs. Thyristor 140 is kept in the on-state by maintaining a sufficient positive voltage on gate 160 with respect to cathode 158 to cause an inversion n-channel in P⁺ body 154. Turning on this n-channel MOSFET connects N well 150 to N⁺⁺ region 156, and permits conduction through the device.

The device of FIG. 4 is triggered to the on-state in the reverse mode by applying a sufficient negative voltage to gate 160 with respect to cathode 158, while simultaneously applying a negative voltage to anode 142. The negative voltage on gate 160 causes an inversion p-channel in N well 150, which connects P⁻ substrate 148 to P⁺ body 152, which forward biases N-base/P⁻ substrate junction to latch (turn-on) the thyristor. The device operates essentially as an MCT in the reverse direction with current flow from cathode to anode through P⁺ region 152, N well 150, P⁻ substrate 148 and N base layer 144. As in the embodiment of FIG. 2, N⁺⁺ region 156 and P⁺⁺ backside diffusion 146 are inactive in the reverse conduction mode. Also as before, the application of a sufficient positive voltage on gate 160 causes thyristor 140 to turn-off from the reverse conduction mode.

Figure 5:
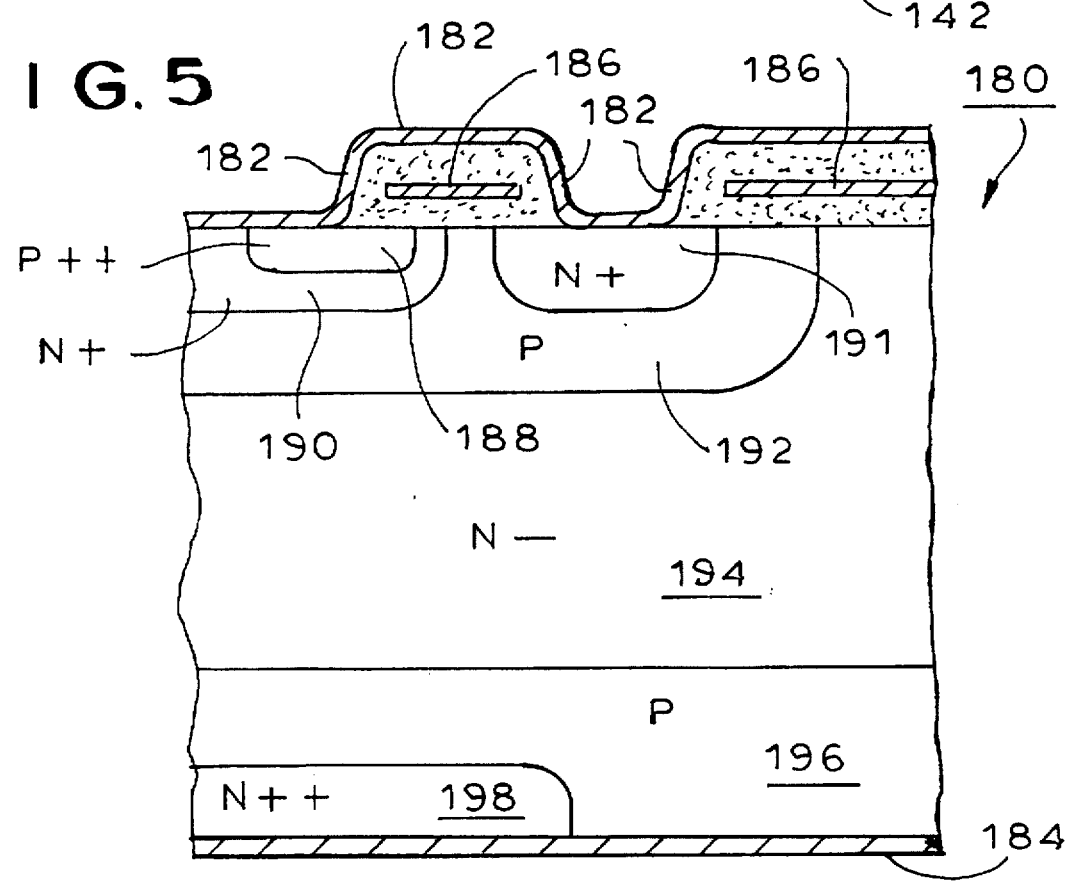
FIG. 5 is a cross-sectional view of the thyristor structure of FIG. 4 with all the N-type layers changed to P-type and all the P-type layers changed to N-type.

A further embodiment of the present invention is illustrated in FIG. 5. This embodiment is structurally the same as bidirectional thyristor 140 of FIG. 4, but with opposite doping and current flow. Thus, in the embodiment of FIG. 5, anode 182 covers the upper surface of the device and cathode 184 covers the bottom surface of the device. With anode 182 positive with respect to cathode 184 and with a sufficiently negative voltage applied to insulated gate 186, current flows downward in the forward direction from anode to cathode through P⁺⁺ region 188, through the n-channel formed in N⁺ body 190, and through P well 192, N⁻ substrate 194, P base layer 196 and N⁺⁺ backside diffusion 198. In the reverse direction, with anode 182 negative with respect to cathode 184, and with a sufficiently positive voltage applied to insulated gate 186 to invert P well 192, current flows from cathode to anode through P base layer 196, N⁻ substrate 194, P well 192, and N⁺ body 191.

Figure 6:
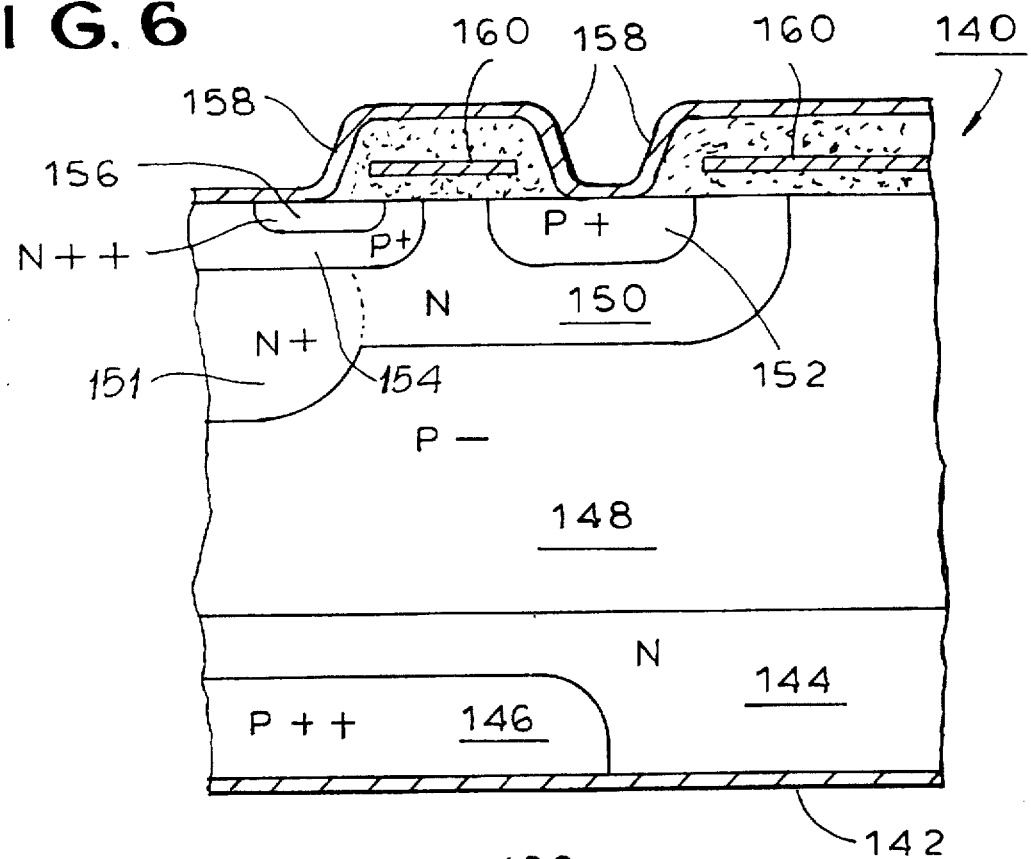
FIG. 6 is a cross-sectional view of the thyristor structure of FIG. 4 with a deep well diffusion.
Figure 7:
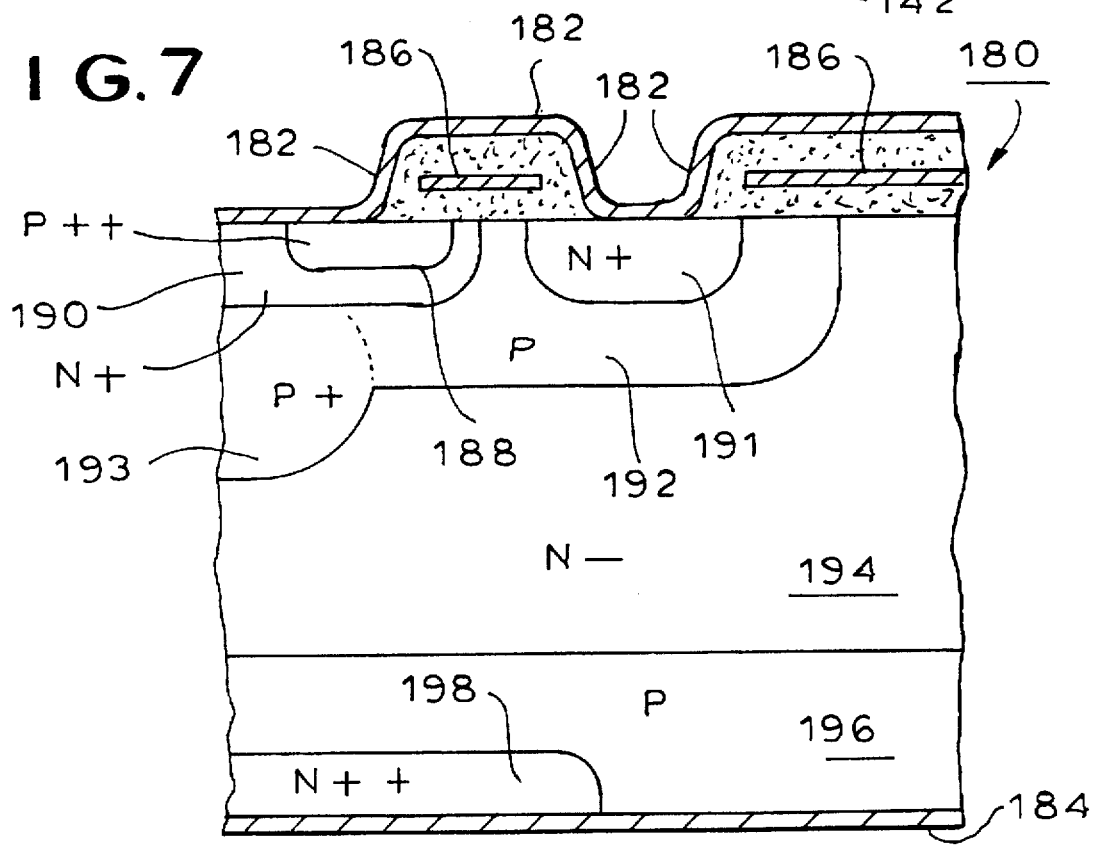
FIG. 7 is a cross-sectional view of the thyristor structure of FIG. 5 with a deep well diffusion.

FIGS. 6 and 7 shows cross-sectional views of embodiments which are structurally similar to those of FIGS. 4 and 5, respectively, but further include a deep, highly doped portion in the well region. The N well 150 of FIG. 6 includes deep N⁺ portion 151, and P well 192 of FIG. 7 includes deep P⁺ portion 193. The devices shown in FIGS. 4 and 5 are easily fabricated. The devices shown in FIGS. 6 and 7 require an extra diffusion for the deep portions of the wells, but advantageously have better on-state current conduction characteristics in the forward direction because of increased emitter-injection efficiency of the top transistor.

Figure 8:
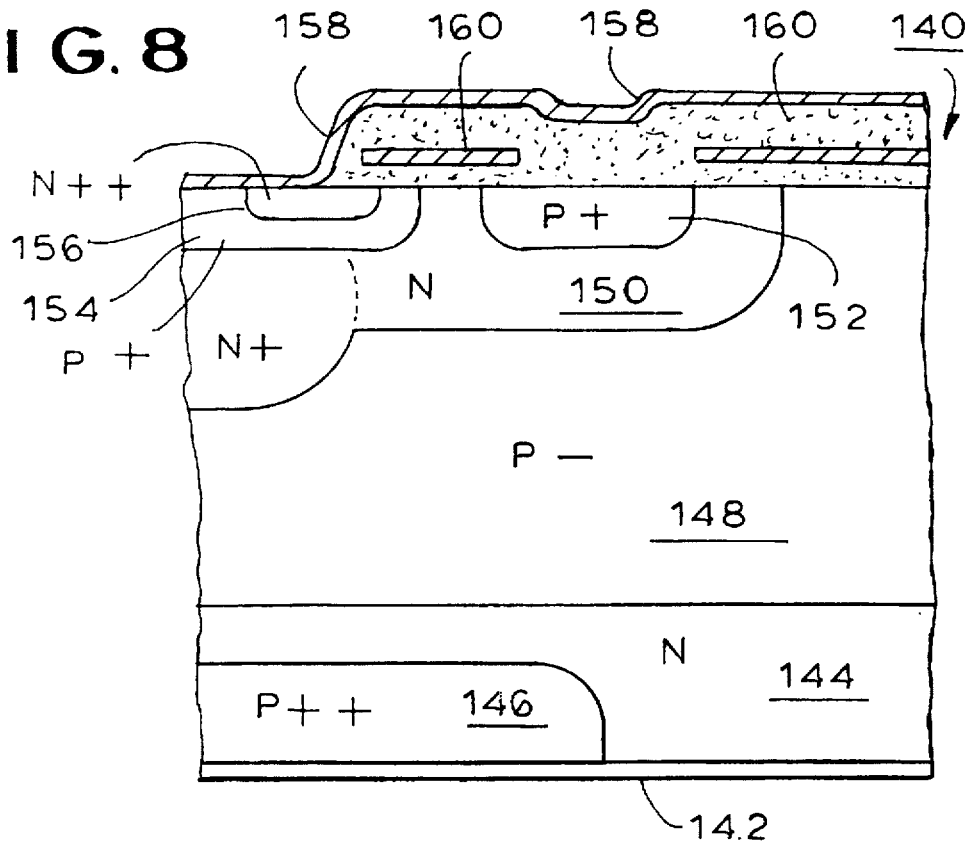
FIG. 8 is a cross-sectional view of an embodiment of the invention with current saturation characteristics in both the forward and reverse direction.
Figure 9:
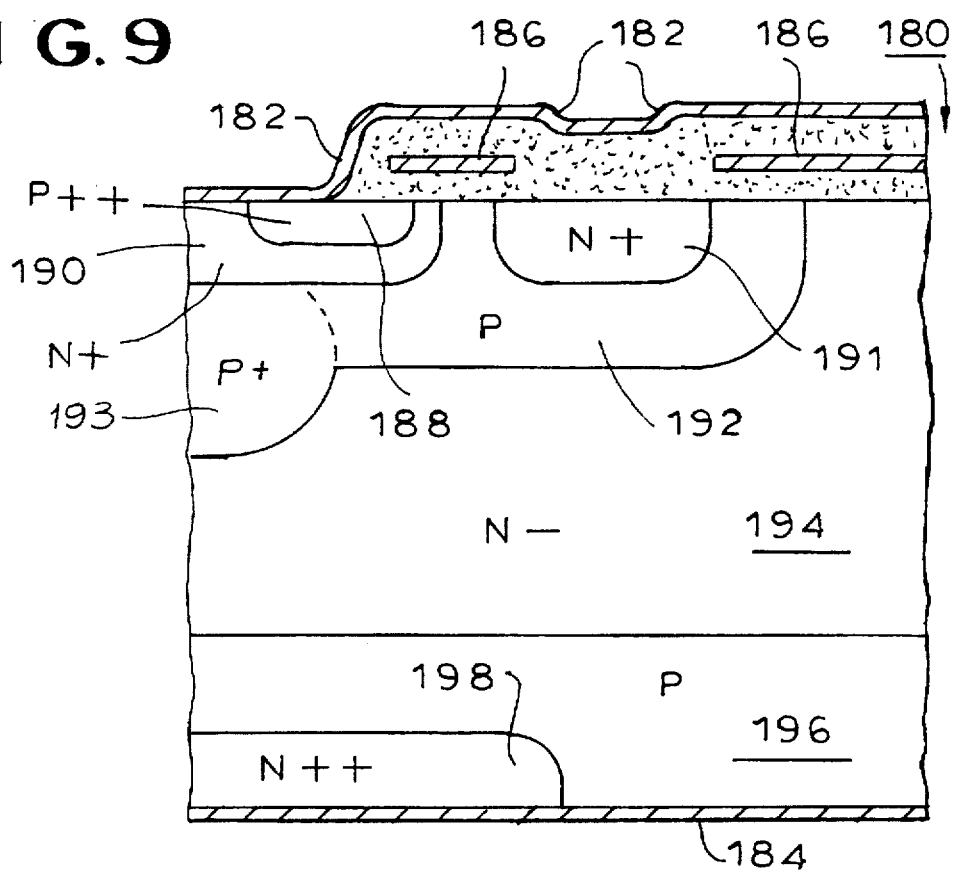
FIG. 9 is a cross-sectional view of the thyristor structure of FIG. 8 with all the N-type layers changed to P-type and all the P-type layers changed to N-type.

FIGS. 8 and 9 show cross-sectional views of embodiments which are structurally similar to those of FIGS. 6 and 7, respectively, except that the cathode metal contact to the P⁺ body region 152 is removed in FIG. 8 and the anode metal contact to the N⁺ body region 191 is removed in FIG. 9. The devices shown in FIGS. 8 and 9 advantageously have on-state current saturation characteristics in both the forward and reverse directions. However, the devices shown in FIGS. 8 and 9 have parasitic thyristors in the reverse direction formed by P body 154—N well 150—P⁻ substrate 148—N base region 144 and N body 190⁺—P well 192—N⁻ substrate 194—P region 196, respectively. The deep, highly doped portion in the well region helps to suppress latch-up of the parasitic thyristor in the reverse direction, while also helping to increase the emitter-injection efficiency of the top transistor.

Figure 10:
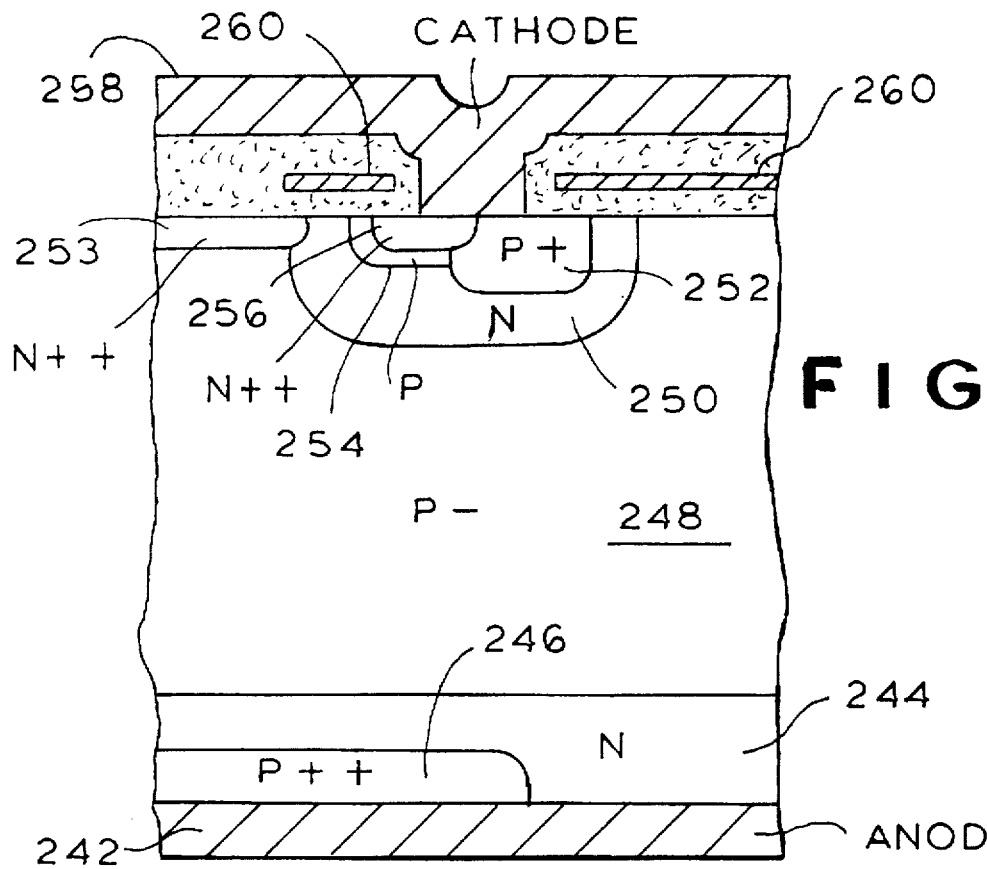
FIG. 10 is a cross-sectional view of an embodiment of the invention which does not require an extra diffusion for the deep portions of the wells.
Figure 11:
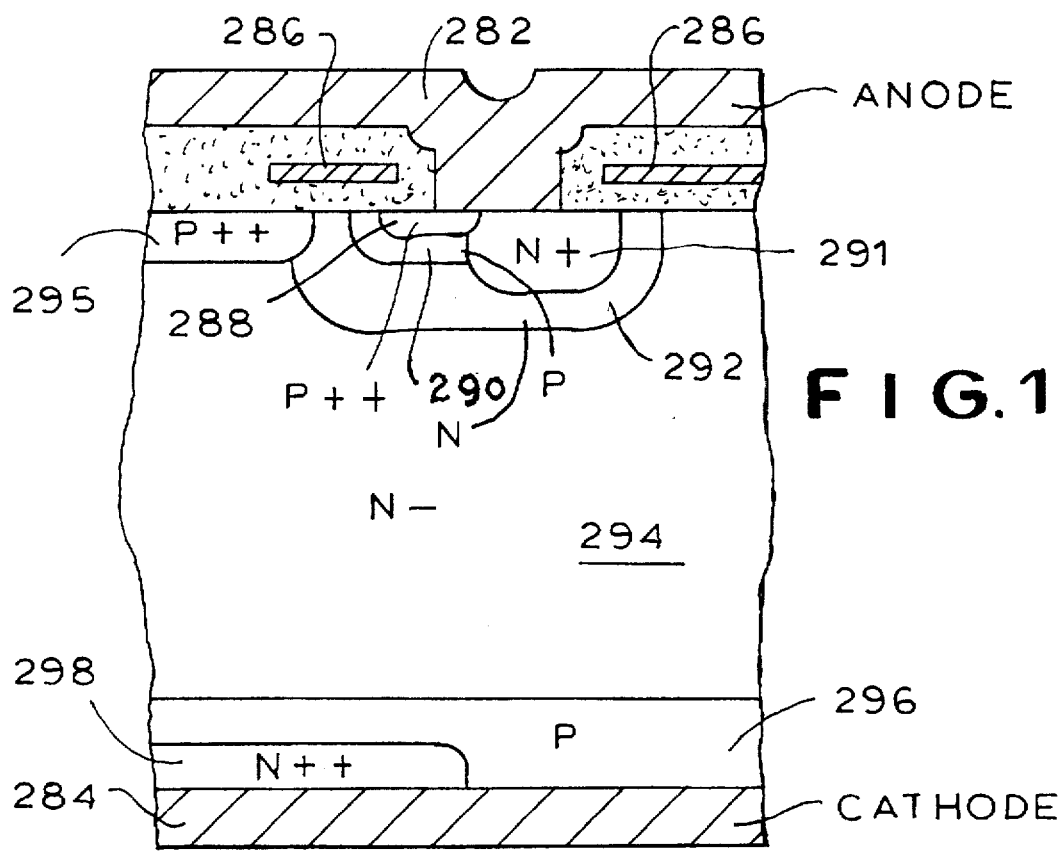
FIG. 11 is a cross-section view of the thyristor structure of FIG. 10 with all of the N-type layers changed to P-type and all the P-type layers changed to N-type.

The devices shown in FIGS. 6 and 7 require an extra diffusion for the deep portions of the wells to have increased emitter-injection efficiency and lower on-state voltage drop in the forward direction. Another embodiment shown in FIGS. 10 and 11 achieves increased emitter-injection efficiency and lower on-state voltage drop without use of an extra diffusion for the deep portions of the wells. The device shown in FIG. 10 has a N⁺⁺ layer 253 on P⁻ substrate 248.

The N$^{++}$ layer 253 can be formed in the same process steps when the N$^{++}$ source region 256 is fabricated. The device shown in FIG. 11 has a P$^{++}$ layer 295 which can be formed in the same process steps when the P$^{++}$ region 288 is fabricated.

Figure 12:
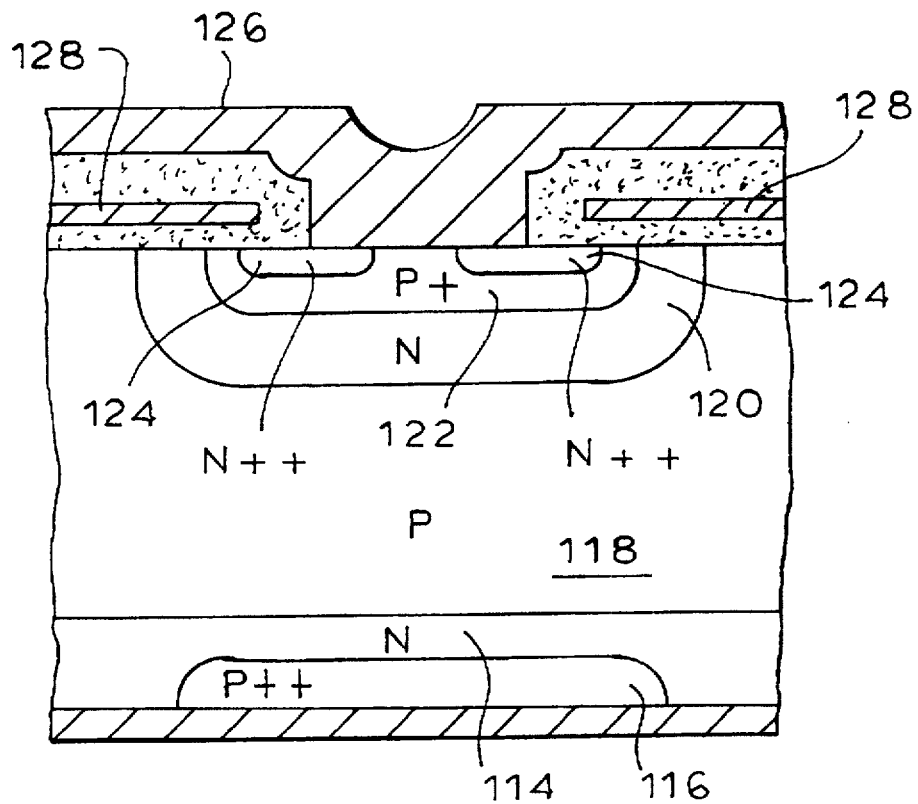
FIG. 12 is a cross-sectional view of a full cell of the thyristor of FIG. 2.

The bidirectional thyristor of the present invention is preferably provided in a cellular topology similar to that disclosed and claimed in U.S. Pat. No. 5,008,725, herein incorporated by reference. FIGS. 2 and 4–11 show a half cell of each embodiment. A full unit cell in each case is obtained by adding a mirror image of the structure on the left-hand side. Thus, for example, a full unit cell of the embodiment of FIG. 2 is shown in FIG. 12. The invention is implemented in the preferred embodiment by providing a large number of these full unit cells in a polygonal shape and in a parallel-connection on a single chip with a termination structure similar to the power MOSFET design shown in U.S. Pat. No. 5,008,725. Thus, gate 128 comprises a polysilicon grid which overlays the channel regions of adjacent cells and the "common conduction region" therebetween.

Figure 13:
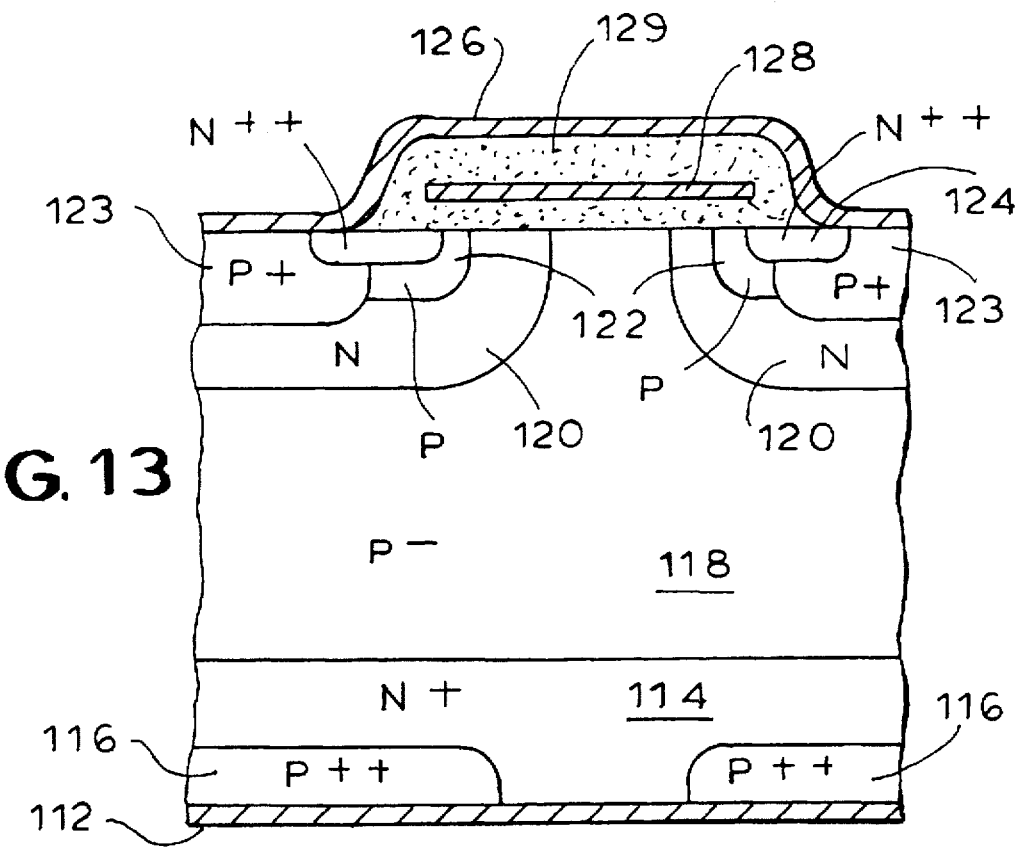
FIG. 13 is a cross-sectional view of a full cell of the thyristor of FIG. 2 with a deep body structure.
Figure 14:
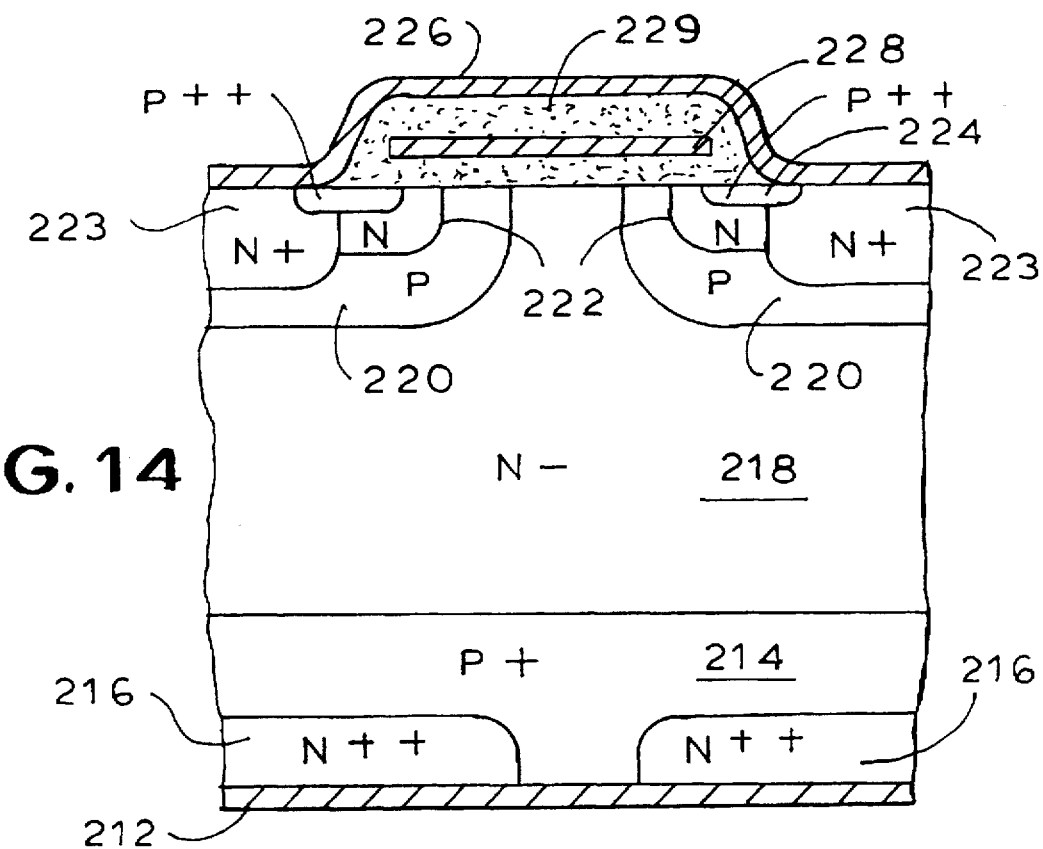
FIG. 14 is a cross-sectional view of a full cell of the thyristor of FIG. 2 with a deep body structure and with all the N-type layers changed to P-type and all the P-type layers changed to N-type.

FIG. 13 shows alternative configuration of the cell of FIG. 12 in which each of the body regions includes a relatively deep P$^+$ body region 123 similar to the power MOSFET design shown in U.S. Pat. No. 4,642,666. FIG. 14 shows an embodiment which is structurally the same as cellular design of FIG. 13, but with opposite doping and current flow, and which includes a relatively deep N$^+$ body region 223. A comparison of FIGS. 13 and 14 with the power MOSFET cell cross-section shown in the '666 and '725 patents will reveal that the present invention is similar except that: 1) the lightly doped drift layer (identified by reference numerals 118, 218 in FIGS. 13 and 14, respectively) of the present invention is formed of an opposite conductivity type material as compared to that of a power MOSFET; 2) the present invention includes a well region (identified by reference numerals 120, 220 in FIGS. 9 and 10, respectively) which encompasses the base region; and 3) the present invention includes a backside diffusion (identified by reference numerals 116, 216 in FIGS. 13 and 14, respectively).

Figure 15:
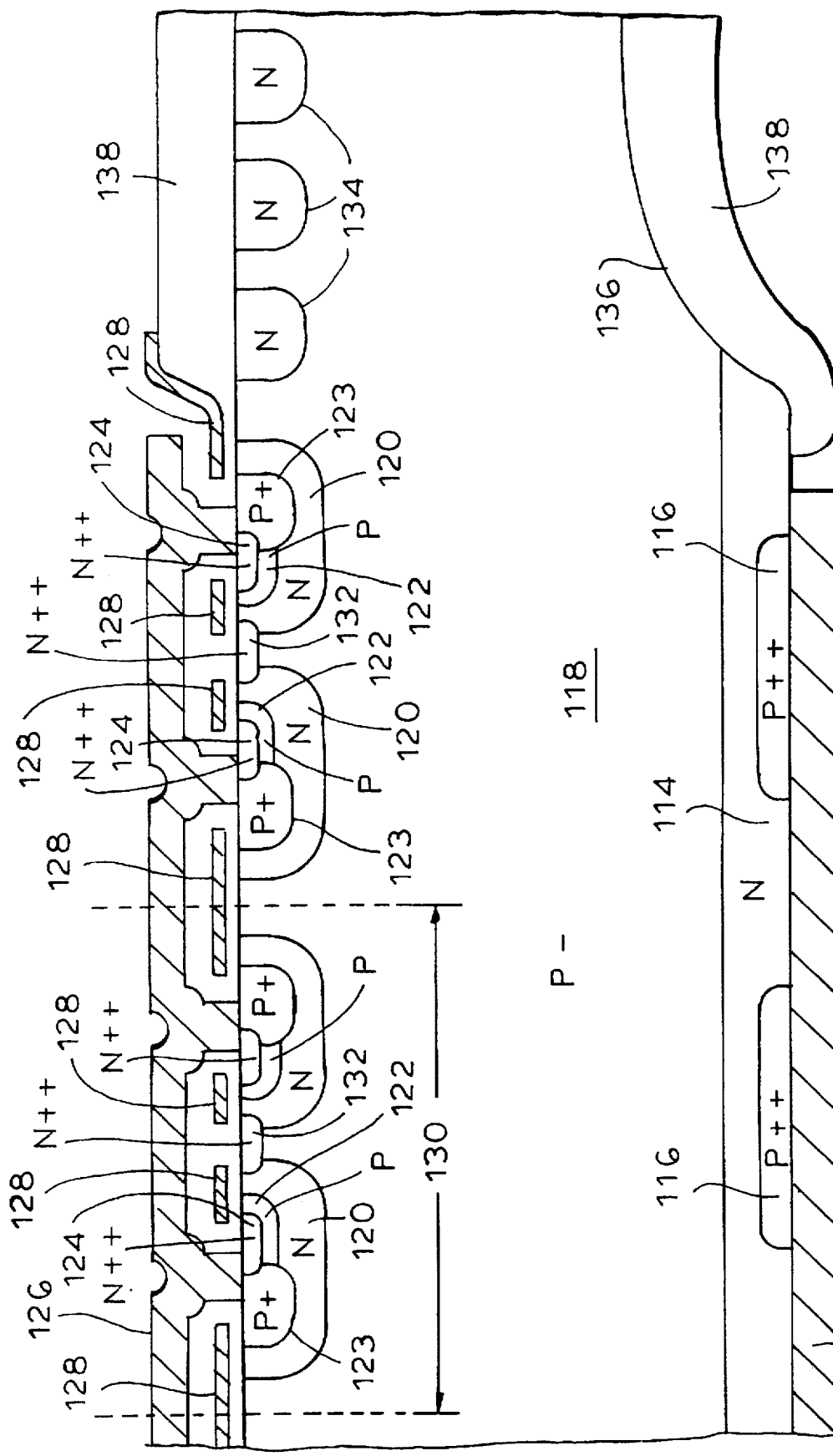
FIG. 15 is an extended cross-sectional view of the preferred cellular configuration of the present invention with the conductivity polarity of FIG. 13.
Figure 16:
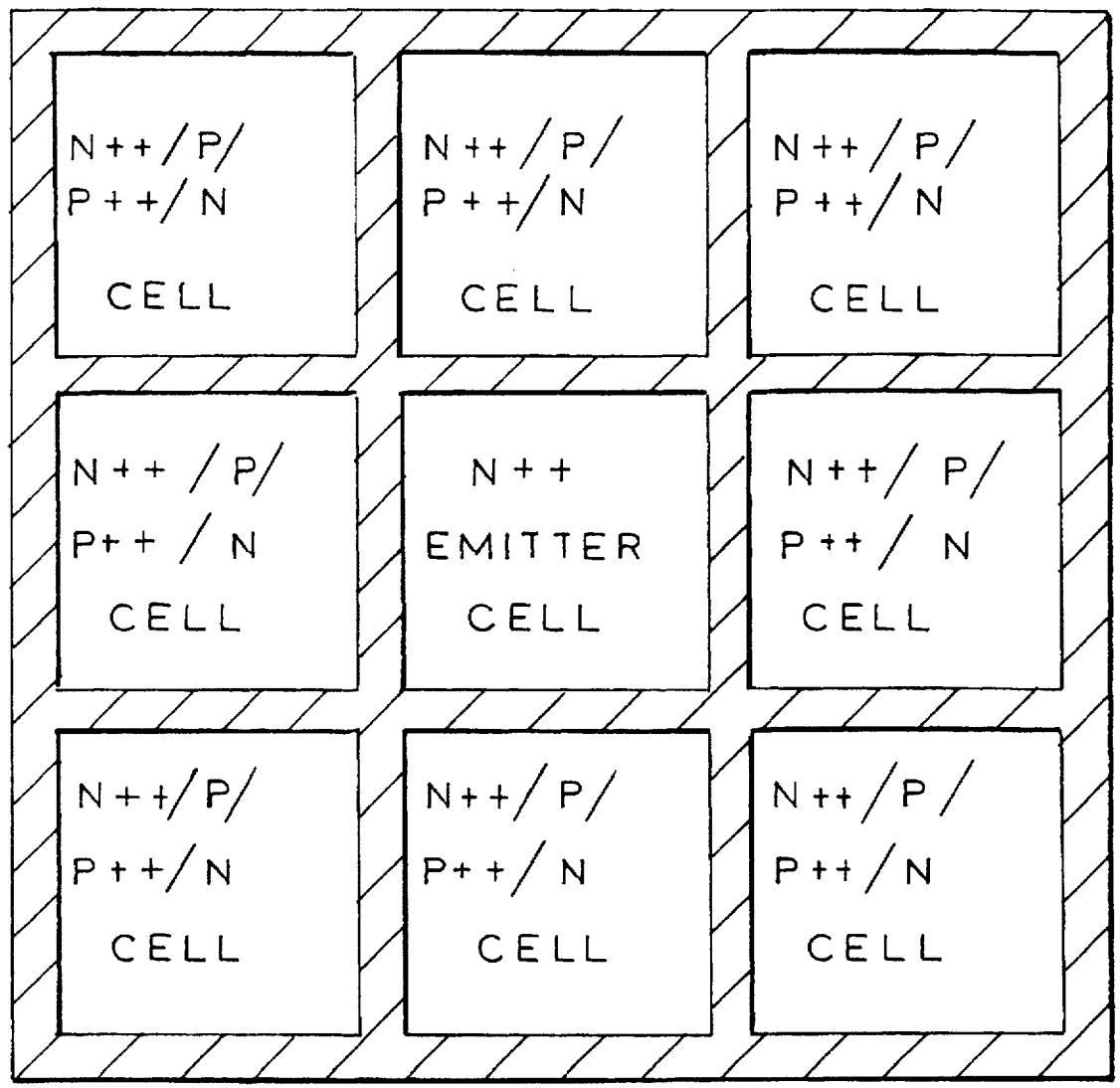
FIG. 16 is a top view of a cluster of cells which is then repeated as an array to form the active device.
Figure 17:
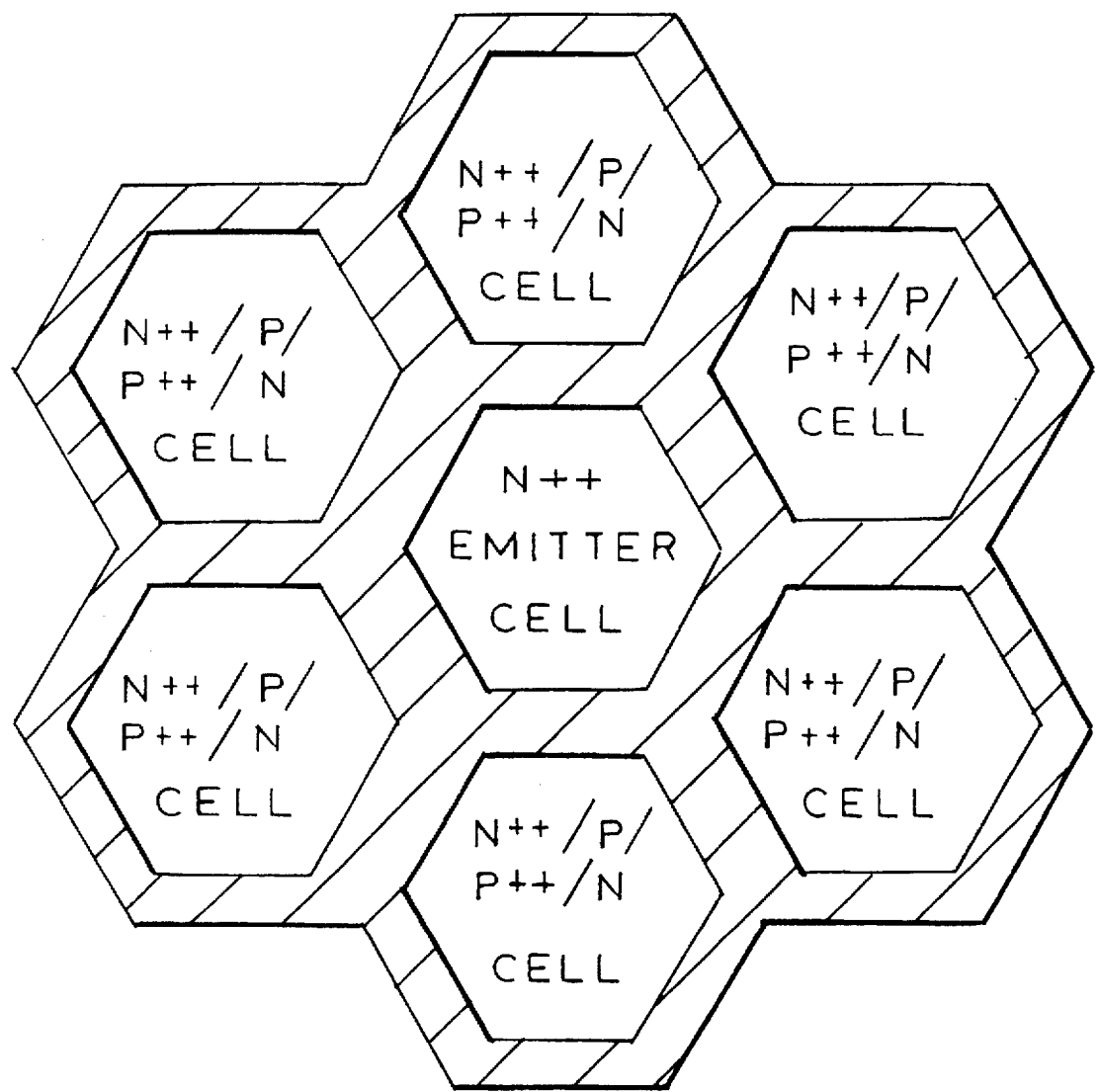
FIG. 17 is a top view of another possible arrangement of a cluster of cells, which is then repeated as an array to form the active device.

FIG. 15 shows an extended cross-sectional view of the preferred cellular configuration of the present invention with the conductivity polarity of FIG. 13, wherein like elements are indicated with like reference numerals. A basic unit cell cluster cross-section of the present invention, which is repeated over the surface of the wafer, is identified by reference numeral 130. The top view of two possible cell clusters is shown in FIG. 16 and FIG. 17. As shown in FIG. 15, a N$^{++}$ diffusion 132 may be provided in P$^-$ substrate layer 118 between adjacent N well regions 120. The N$^{++}$ diffusion 132 is optional and serves to increase the emitter-injection efficiency of the NPN transistor in the forward conduction mode. An alternative option (not shown) is to provide a buried N$^+$ region in some cell areas below P body 122.

As shown in FIG. 15, a plurality of termination rings are provided at the edge of the semiconductor wafer. Specifically, the edge of the upper surface of the wafer is provided with a plurality of N-type termination rings 134 for the reverse blocking junction, whereas the edge of the bottom surface of the wafer is provided with a Contour Edge Termination 136 for the forward blocking junction. A layer of field oxide and LTO (low temperature oxide), identified by reference numeral 138 is provided at the edge on the upper and bottom surfaces of the wafer.

Figure 18:
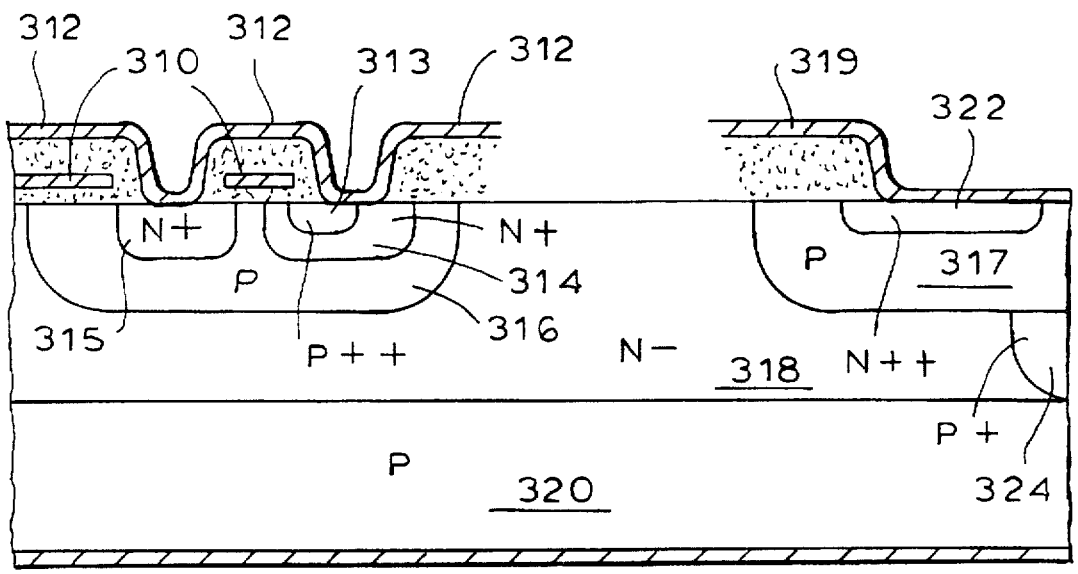
FIG. 18 is a cross-sectional view of a lateral conduction embodiment of the invention.

The bidirectional thyristor of the present invention can also be provided in a lateral conduction configuration. Thus, for example, FIG. 18 shows a lateral conduction configuration of the FIG. 5 embodiment of the invention. In the forward direction (anode positive with respect to cathode), with a sufficiently negative voltage applied to insulated gate 310 with respect to the anode to create a p-channel in N body 314, current flows from anode 312 to cathode 319 through P$^{++}$ source 313, p-channel in N body 314, P well 316, across N$^-$ epi 318 and through P well 317 and N$^{++}$ region 322. In the reverse direction (anode negative with respect to cathode), with a sufficiently positive voltage applied to gate 310 with respect to the anode to create an n-channel in P well 316, current flows from cathode 319 to anode 312 through P well 317, N$^-$ epi 318, P well 316, and N body 315. A P$^+$ region 324 is formed in P substrate 320 on the right side of the cell under cathode 319 to isolate the cell from other cells on the chip.

Figure 19:
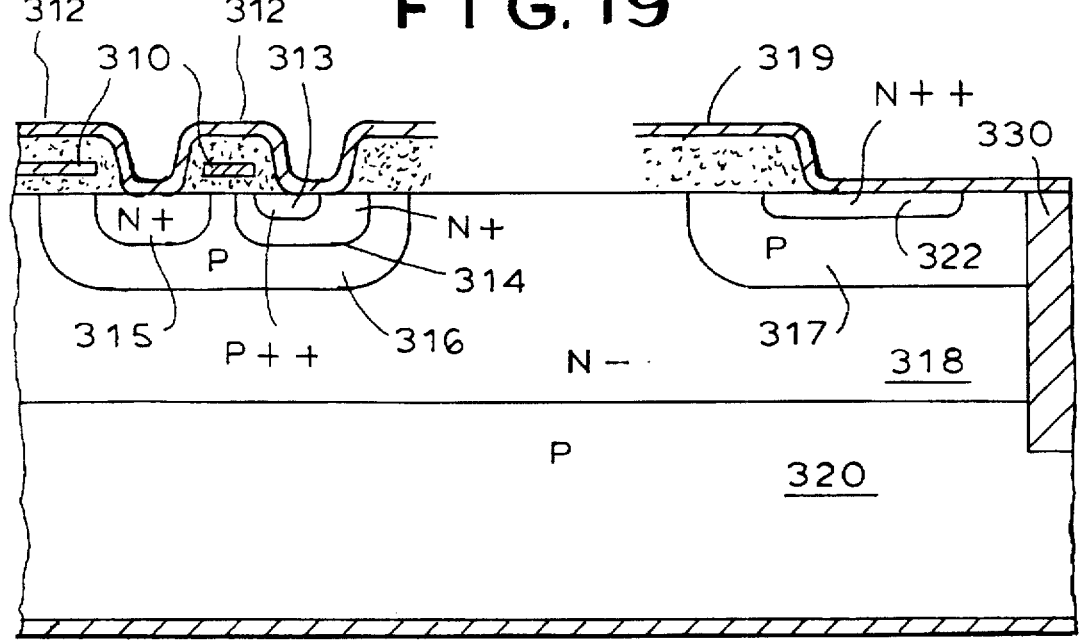
FIG. 19 is a cross-sectional view of an alternative lateral conduction embodiment with trench isolation.
Figure 24:
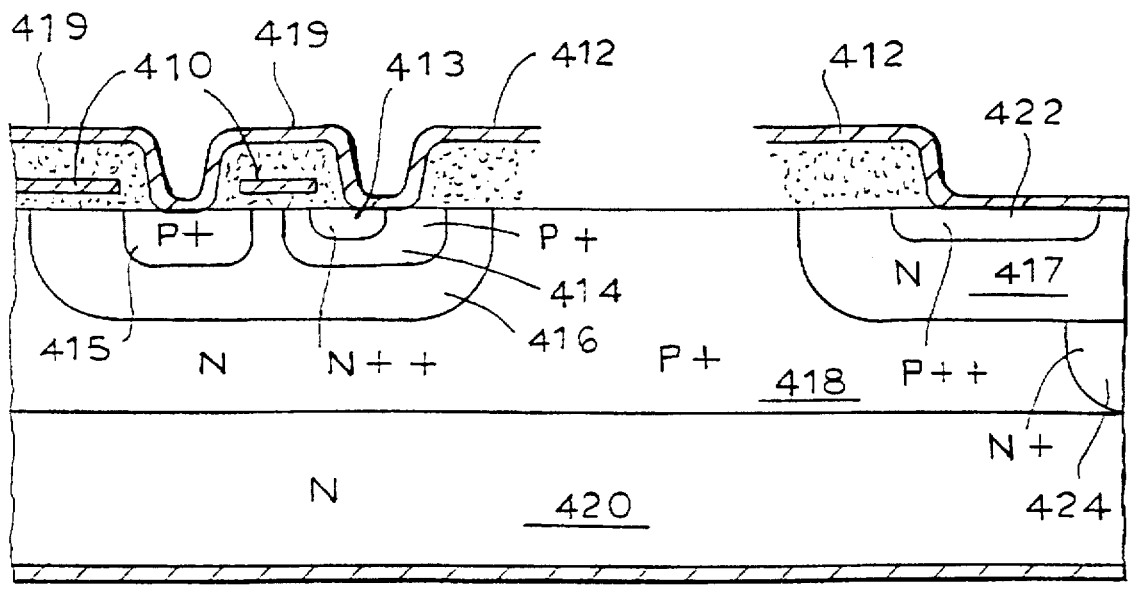
FIGS. 24 and 25 are cross-sectional views of the thyristor structures of FIGS. 18 and 19, respectively, with all the N-type layers changed to P-type and all the P-type layers changed to N-type.
Figure 25:
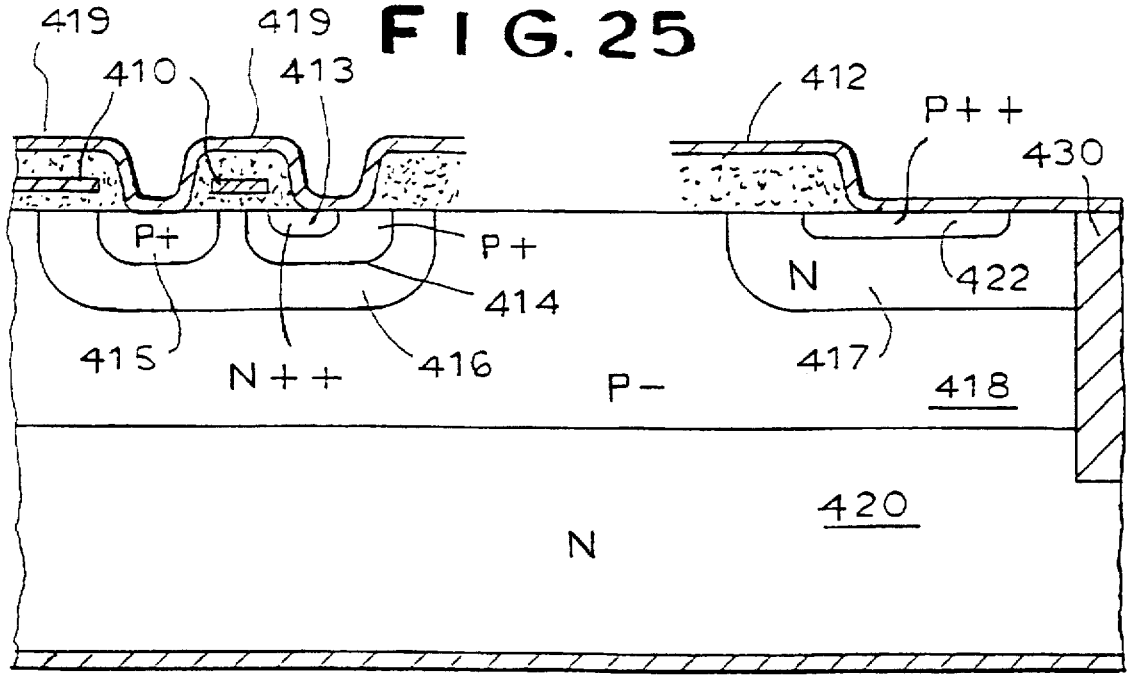

A second lateral conduction embodiment of the invention is shown in FIG. 19. This embodiment is similar to that of FIG. 18, but includes trench isolation 330 in place of P$^+$ region 324 and is particularly adapted for power IC applications where the thyristor must be isolated from other power and control devices on the same chip. Further embodiments of the bidirectional thyristor structures of FIGS. 18 and 19 are illustrated in FIGS. 24 and 25, respectively. These embodiments are structurally the same, but with opposite doping and current flow, and are identified by corresponding reference numerals 412–424.

Figure 20:
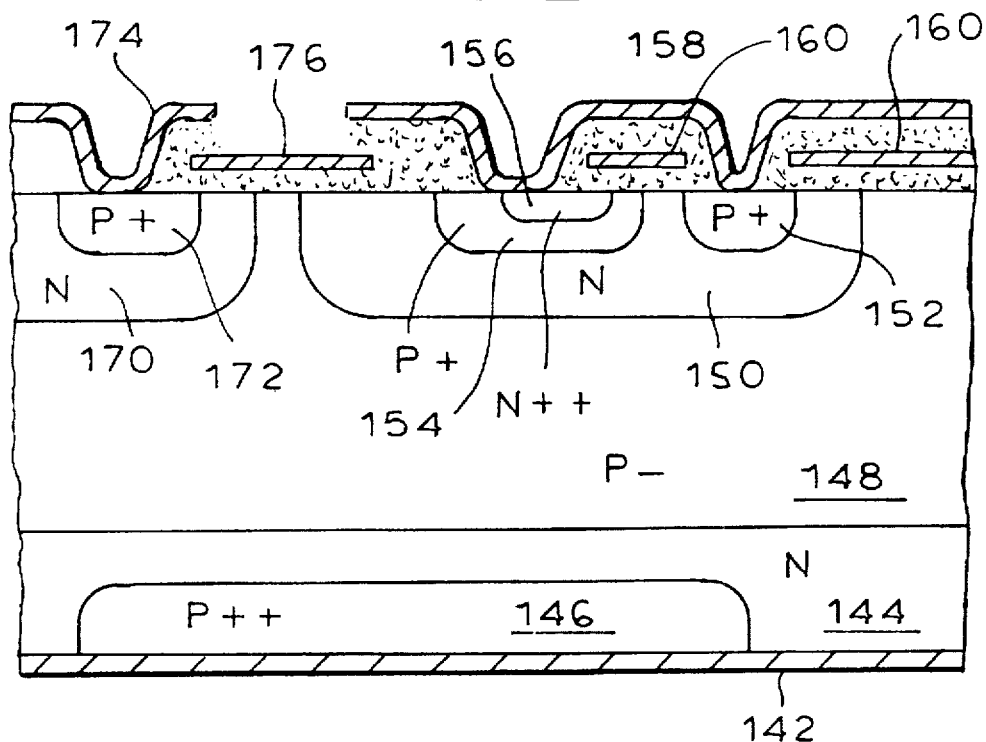
FIG. 20 is a cross-sectional view of an embodiment of the invention with an integrated MOS-gated forward direction turn-on cell.

FIG. 20 shows an embodiment of the invention having the same structure as the vertical conduction embodiment of FIG. 4, but also includes an integrated MOS-gated forward direction turn-on cell. The turn-on cell consist of an N well 170 encompassing a P body 172 which extends downward from the upper surface of the wafer, N well 170 being spaced from N well 150. An auxiliary electrode 174 is provided on the upper surface of the wafer and contacts P body 172. A second insulated gate 176 is also provided on the upper surface of the wafer, gate 176 overlying the portion of N well 150 which extends to the upper surface of the wafer, the portion of P$^-$ substrate 148 which extends to the upper surface of the wafer between the spaced N wells, the portion of the N well 170 which extends to the upper surface of the wafer and at least the edge of the portion of the P body 172 which extends to the upper surface of the wafer.

In the operation of the device of FIG. 20, auxiliary electrode 174 is biased to a potential slightly higher (e.g. 1 volt) than the potential of cathode 158. This enables the thyristor to be triggered on in the forward direction (anode positive with respect to cathode) using MOS gate control (namely, by applying a sufficiently positive potential to gate 160 with respect to cathode 158 to create an n-channel in P$^+$ body 154 and by applying a sufficiently negative potential to gate 176 with respect to cathode 158 to create a p-channel in N well 170.

Figure 21:
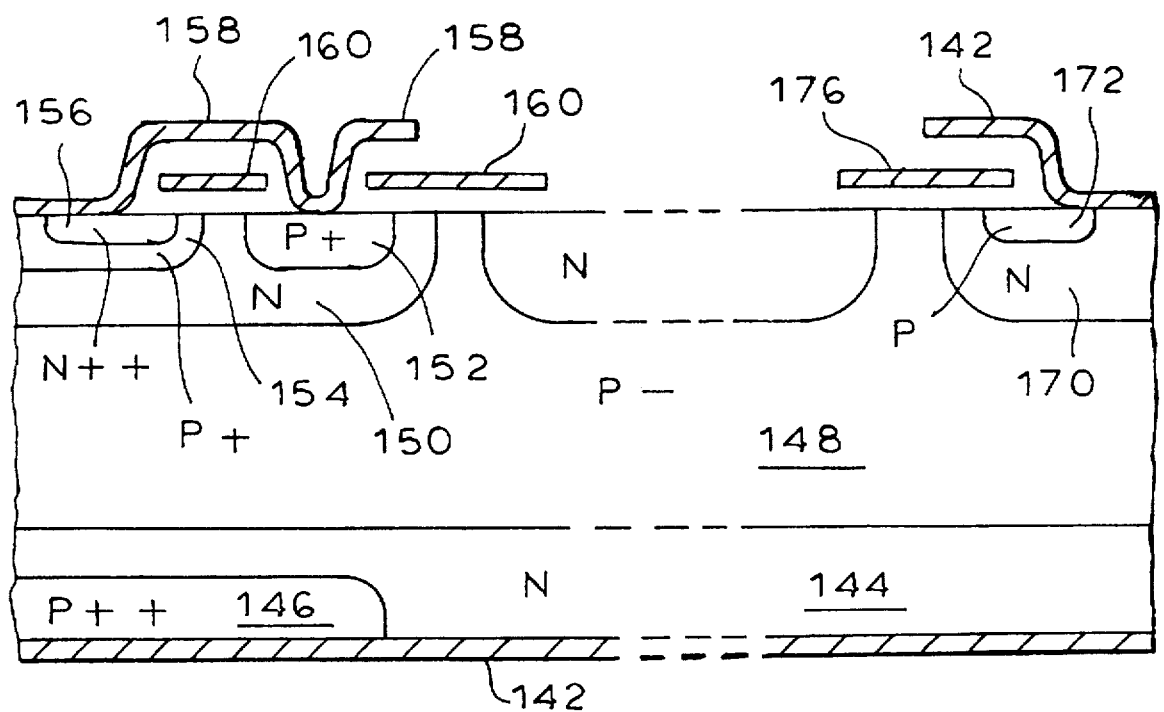
FIG. 21 is a cross-sectional view of an alternative structure enabling MOS-controlled turn-on in the forward direction.

FIG. 21 shows the cross-section of an alternative structure enabling MOS-controlled turn-on in the forward direction (anode positive with respect to cathode, gate 160 positive with respect to cathode 158, and gate 176 negative with respect to anode 142). This structure has a lateral thyristor like the embodiments of FIGS. 18 and 19 in addition to the vertical thyristor of FIG. 4).

Figure 22:
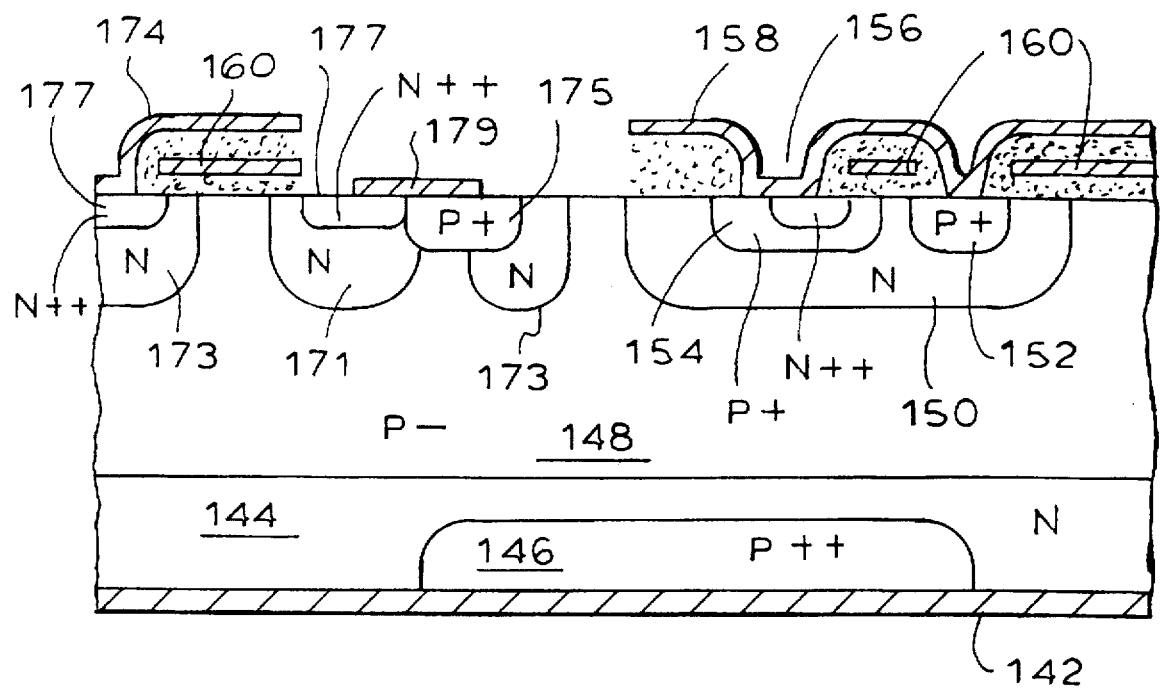
FIG. 22 is a cross-sectional view of a modification of the embodiment of FIG. 20 with an integrated MOS-gated forward direction turn-on cell with a single gate electrode.

Other structures are possible utilizing a single polarity gate drive. For example, the structure shown in FIG. 20 can be modified as shown in FIG. 22, in which N well 170 is replaced with a pair of spaced N wells 171, 173, a P body 175 being formed in N well 173 and a N$^{++}$ region 177 being formed in N well 171. P body 175 and N$^{++}$ region 177 are electrically connected by a floating metal strap 179 on the upper surface of the semiconductor wafer.

In the operation of the device of FIG. 22, auxiliary electrode 174 is biased to a potential slightly higher (eg. 1 volt) than the potential of cathode 158. This enables the thyristor to be triggered on in the forward direction (anode positive with respect to cathode) using MOS gate control (namely, by applying a sufficiently positive potential to gate 160 with respect to cathode 158 to create n-channels in $P^+$ body 154 and $P^-$ region 148 between N well 173 and 171). This connects the $P^-$ region 148 close to the potential of the auxiliary electrode 174, through P body 175, through the metal strap 179, through the $N^{++}$ region 177, through the n-channel in the $P^-$ region 148 between N wells 173 and 171, through the $N^{++}$ region 177. This forward biases the $P^-$ region 148/N well 150 junction to cause injection of carriers, triggering the thyristor.

Figure 23:
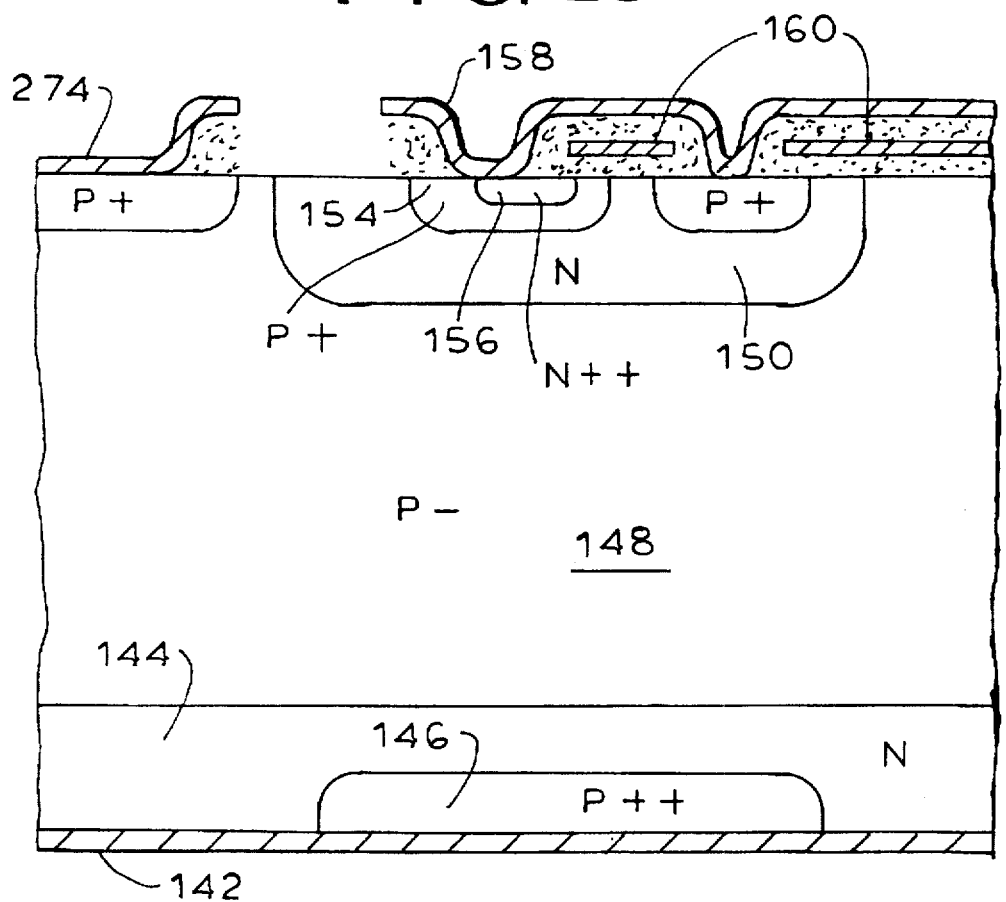
FIG. 23 is a cross-sectional view of a modification of the embodiment of FIG. 20, utilizing a current turn-on gate.

Other structures are possible, utilizing a current turn-on gate. For example, the structure shown in FIG. 20 can be modified as shown in FIG. 23, in which the N well 170 and MOS gate 176 are removed. In the operation of the device of FIG. 23, auxiliary electrode 274 is used to inject current into the $P^-$ substrate 148. This supplies the base drive current for the upper NPN transistor formed by N well 150, $P^-$ substrate 148 and N region 144, and enables the thyristor to be triggered on in the forward direction (anode positive with respect to cathode) using gate control (namely, MOS gate 160 sufficiently positive with respect to cathode 158 to create an n-channel in $P^+$ body 154, and gate 274 injecting current into $P^-$ substrate 148 to trigger the thyristor on).

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOS gate controlled bidirectional thyristor, comprising:

a wafer of semiconductor material having first and second spaced, parallel planar surfaces, at least a portion of the thickness of said wafer which extends from said first planar surface comprising a relatively lightly doped N-type substrate for receiving junctions, at least a portion of the thickness of said wafer which extends from said second surface comprising a P-type base region;

a first P-type well region formed in said relatively lightly doped substrate and extending from said first semiconductor surface to a first depth beneath said first semiconductor surface;

a first N-type body region formed in said first well region and extending from said first semiconductor surface to a second depth beneath said semiconductor surface which is shallower than said first depth, said first body region being radially inwardly spaced along said first semiconductor surface from said well region thereby to define a first channel region along said first semiconductor surface between said first body region and said relatively lightly doped substrate;

at least one P-type source region formed in said first body region and extending from said first semiconductor surface to a third depth beneath said semiconductor surface which is shallower than said second depth, said source region being radially inwardly spaced along said first semiconductor surface from said first well region thereby to define a second channel region along said first semiconductor surface between said source region and said first well region;

first electrode means comprising an anode disposed on said first semiconductor surface and connected to said first body region and said source region;

gate insulation layer means on said first surface disposed at least on said first and second channel regions region and on said first well region;

gate electrode means on said gate insulation layer means and overlying said first and second channel regions and said well region;

a second P-type well region extending from said first surface of said wafer, said second well region being laterally spaced from said first well region;

at least one relatively highly doped N-type region formed within said second well region; and second electrode means comprising a cathode disposed on said first semiconductor surface and connected to said relatively highly doped N-type region and to said second well region.

2. The bidirectional thyristor of claim 1, further comprising a second N-type body region formed in said first well region, said second body region being spaced from said relatively lightly doped substrate by a portion of said first well region, and said anode being connected to said second body region, said first body region and said source region formed in said first body region.

3. The bidirectional thyristor of claim 1, further comprising a second N-type body region formed in said first well region, said second body region being spaced from said relatively lightly epitaxially deposited region by a portion of said first well region, and said anode being connected to said first body region and said source region formed in said first body region, and wherein said first well region has a profile which includes a relatively deep, relatively highly doped portion disposed below said first body region.

4. The bidirectional thyristor of claim 1, further comprising trench isolation means extending from said first semiconductor surface adjacent said second well region.

5. A MOS gate controlled bidirectional thyristor, comprising:

a wafer of semiconductor material having first and second spaced, parallel planar surfaces, at least a portion of the thickness of said wafer which extends from said first planar surface comprising a relatively lightly doped P-type substrate for receiving junctions, at least a portion of the thickness of said wafer which extends from said second surface comprising a N-type base region;

a first N-type well region formed in said relatively lightly doped substrate and extending from said first semiconductor surface to a first depth beneath said first semiconductor surface;

a first P-type body region formed in said first well region and extending from said first semiconductor surface to a second depth beneath said semiconductor surface which is shallower than said first depth, said first body region being radially inwardly spaced along said first semiconductor surface from said well region thereby to define a first channel region along said first semiconductor surface between said first body region and said relatively lightly doped substrate;

at least one N-type source region formed in said first body region and extending from said first semiconductor surface to a third depth beneath said semiconductor surface which is shallower than said second depth, said source region being radially inwardly spaced along said first semiconductor surface from said first well region thereby to define a second channel region along said first semiconductor surface between said source region and said first well region;

first electrode means comprising a cathode disposed on said first semiconductor surface and connected to said first body region and said source region;

gate insulation layer means on said first surface disposed at least on said first and second channel regions region and on said first well region;

gate electrode means on said gate insulation layer means and overlying said first and second channel regions and said well region;

a second N-type well region extending from said first surface of said wafer, said second well region being laterally spaced from said first well region;

at least one relatively highly doped P-type region formed within said second well region; and second electrode means comprising an anode disposed on said first semiconductor surface and connected to said relatively highly doped P-type region and to said second well region.

6. The bidirectional thyristor of claim 5, further comprising a second P-type body region formed in said first well region, said second body region being spaced from said relatively lightly doped substrate by a portion of said first well regions and said cathode being connected to said second body region, said first body region and said source region formed in said first body region.

7. The bidirectional thyristor of claim 5, further comprising a second P-type body region formed in said first well region, said second body region being spaced from said relatively lightly epitaxially deposited region by a portion of said first well region, and said cathode being connected to said first body region and said source region formed in said first body region, and wherein said first well region has a profile which includes a relatively deep, relatively highly doped portion disposed below said first body region.

8. The bidirectional thyristor of claim 5, further comprising trench isolation means extending from said first semiconductor surface adjacent said first well region.

* * * * *